United States Patent [19]

Brehmer et al.

[11] Patent Number: 4,458,212

[45] Date of Patent: Jul. 3, 1984

[54] COMPENSATED AMPLIFIER HAVING POLE ZERO TRACKING

[75] Inventors: Kevin E. Brehmer, Sunnyvale, Calif; John A. Fisher, Addison, Tex.

[73] Assignee: Mostek Corporation, Carrollton, Tex.

[21] Appl. No.: 335,628

[22] Filed: Dec. 30, 1981

[51] Int. Cl.³ .............................................. H03F 3/45
[52] U.S. Cl. .................................. 330/260; 330/253; 330/257; 330/261; 330/294
[58] Field of Search ............... 330/253, 260, 261, 294, 330/307

[56] References Cited

U.S. PATENT DOCUMENTS 4,379,267  4/1983  Young ................................. 330/253

Primary Examiner—James B. Mullins

[57] ABSTRACT

A circuit for producing a compensated output signal includes a first and second stage of amplification (18) and (20) and a compensation circuit (16). The first stage of amplification (18) has a signal input, a signal output and a control input. The second stage of amplification (20) also has a signal input, a signal output and a control input with the signal input of the second stage (20) connected to the signal output of the first stage (18). A passive feedback network comprised of a series connected resistor ($R_F$) and capacitor ($C_F$) is connected between the signal input and the signal output of the second stage (20). The combination of the passive feedback network, the first stage (18) and the second stage (20) provide a gain and frequency response that is defined by three poles and one zero. The zero overlaps one of the poles thereby providing an extended frequency response. The passive feedback network varies the frequency response in response to manufacturing process variations. A compensation network (16) is connected to the control inputs of the first and second stages (18) and (20). The output of the compensation network (16) varies in response to manufacturing process variations and compensates the variation of the frequency response due to the feedback network, thereby providing an amplifier having a frequency response independent of manufacturing process variations.

18 Claims, 2 Drawing Figures

COMPENSATED AMPLIFIER HAVING POLE ZERO TRACKING

TECHNICAL FIELD

The present invention pertains to compensation circuits and more particularly to such circuits that compensate the frequency response of an amplifier by tracking poles and zeros with each other.

BACKGROUND OF THE INVENTION

In the design of MOS amplifiers it is important in the initial design that the amplifiers be kept small and dissipate as little power as possible. This is particularly true in transconductance amplifiers, which are repeated a large number of times on a semiconductor chip. These amplifiers have already been reduced in both die size and power by the exclusion of the output stage, and may be further improved by a judicious choice of the compensation technique.

It is also important in each amplifier design that the unity gain bandwidth not greatly exceed the required settling time (as dictated by the clock frequency). Excess amplifier bandwidth results in more broad-band noise being passed through each stage and, subsequently, being aliased into the passband. In amplifier types which exhibit a poor settling response or which are sensitive to process and/or ambient conditions, a large bandwidth may actually be required in order to guarantee that minimum settling requirements are met in the presence of varying operating conditions and process parameters. Two of the parameters that are subject to change over processing are K' and $V_{TO}$. Both of these parameters are functions of substrate doping levels and the capacitance of the oxidation layer. As these terms vary, the transconductance of the active devices on a MOS chip also vary and, depending upon the configuration of an amplifier, the poles and zeros vary, thus changing the frequency response of the amplifier.

In a paper by W. C. Black, D. J. Allstot and R. A. Reed entitled "High Performance Low Power CMOS Channel Filter" in the *IEEE Journal of Solid State Circuits*, Volume SC-15, No. 6, Dec. 1980, a compensation technique is disclosed for adjusting the position of the low frequency right half plane zero. This is a common problem in MOS amplifiers due to the lower transconductance MOS devices. The zero is positioned by the inclusion of a resistor in series with the compensation capacitor. This paper outlines a technique that utilizes an active feedback transistor which is controlled by an external bias circuit. This provides a tracking compensation scheme that is independent of process variations.

The active device utilized as the feedback resistor is controlled by making its size, and the size of an additional transistor in the amplifier, a certain multiple of the sizes of two transistors in the bias circuit.

In view of the above problem there exists a need for a tracking scheme that is independent of processing and places no size requirements on the amplifier transistors in order that they can be optimized to meet other requirements.

SUMMARY OF THE INVENTION

The present invention comprises an amplifying circuit having a compensated output. The selected embodiment of the circuit is described as follows. A first amplifying means is provided having an input and an output. A second amplifying means having an input and an output is provided to amplify the output of the first amplifying means with the input of the second amplifying means connected to the output of the first amplifying means. A passive feedback means is connected between the input and the output of the second amplifying means to determine the frequency response of both the first and second amplifying means. The passive feedback means varies the frequency response of the first and second amplifier stages in response to manufacturing process variations. A compensating bias means is provided to vary the frequency response of the first and second amplifying means in response to manufacturing process variations. The compensating bias means counteracts the frequency of response variations of the first and second amplifying means resulting from the passive feedback means.

BRIEF DESCRIPTION OF THE DRAWINGS

For a more complete understanding of the present invention and the advantages thereof, reference is now made to the following Description taken in conjunction with the accompanying drawings in which.

DETAILED DESCRIPTION

Figure 1:
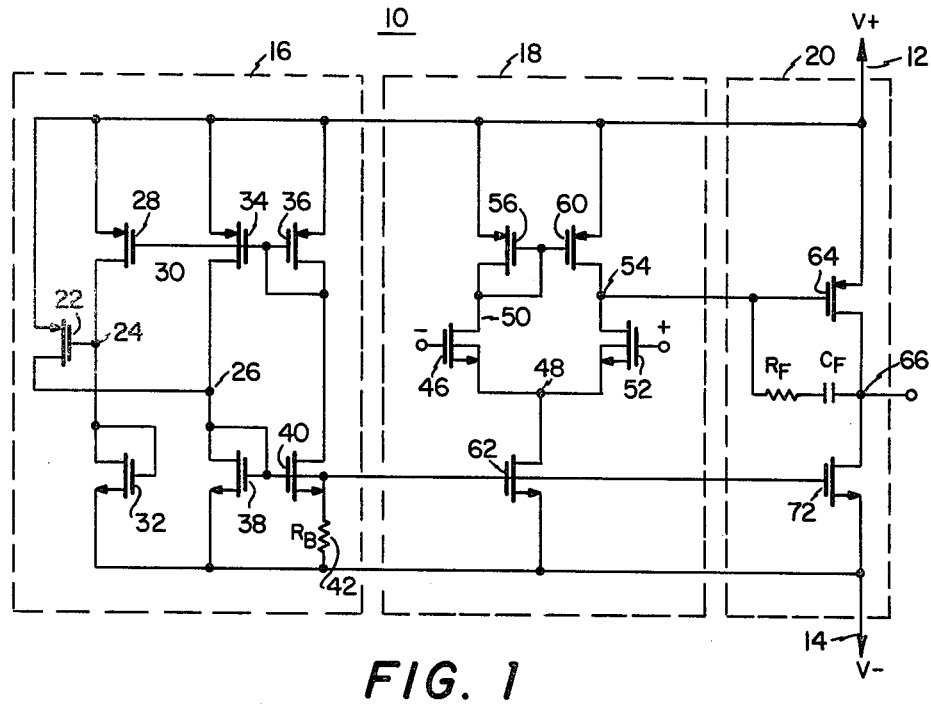
FIG. 1 is a schematic illustration of a circuit for generating a compensated output signal.

Referring now to FIG. 1, a circuit 10 is shown for amplifying a signal. In a preferred embodiment the circuit 10 is fabricated as a transconductance amplifier in conjunction with a bias circuit in which the transconductance amplifier is repeated a large number of times on a semiconductor chip. However, the circuit 10 is useful in any application requiring a compensated amplifier having a frequency response that is substantially independent of variation in supply voltage and processing.

Referring further to FIG. 1, circuit 10 includes first and second power terminals 12 and 14 which are respectively connected to a positive supply and a negative supply. Circuit 10 is functionally partitioned into a compensating bias circuit 16, a first stage of amplification 18 and a second stage of amplification 20 as shown by the dashed lines.

The compensating bias circuit 16 includes a transistor 22 with the source terminal thereof connected to the power terminal 12, the gate terminal thereof connected to a node 24 and the drain terminal thereof connected to a node 26. A transistor 28 has the source terminal thereof connected to the power terminal 12, the gate terminal thereof connected to a node 30 and the drain terminal thereof connected to the node 24. A transistor 32 has the source terminal thereof connected to the power terminal 14, the drain terminal thereof connected to the node 24 and the gate terminal thereof connected to the drain terminal thereof. The transistors 22 and 28 are P channel devices and the transistor 32 is an N channel device. The transistors 22, 28 and 32 comprise a positive feedback startup circuit for the compensating bias circuit 16.

A transistor 34 has the source terminal thereof connected to the power terminal 12, the gate terminal thereof connected to the node 30 and the drain terminal thereof connected to the node 26. A transistor 36 has the source terminal thereof connected to the power terminal 12, the gate terminal thereof connected to the node 30 and the drain terminal thereof connected to the gater terminal thereof. The transistors 34 and 36 are P channel devices and form a current mirror. The current flowing from the source to the drain of the transistor 36 is proportional to the current flowing from the source to the drain terminals of the transistors 34. The width to length ratios of the respective channels of the transistors 34 and 36 will determine the current ratio.

A transistor 38 has the source terminal thereof connected to the power terminal 14, the drain terminal thereof connected to the node 26 and the gate terminal thereof connected to the drain terminal thereof. A transistor 40 has the drain terminal thereof connected to the drain terminal of the transistor 36 and the gate terminal thereof connected to the gate terminal of the transistor 38. A resistor $R_B$ is connected between the source terminal of the transistor 40 and the power terminal 14. Transistors 38 and 40 are N channel devices.

The current flowing through the transistor 40 creates a voltage across the resistor $R_B$. The $V_{gs}$ of the transistor 38 is equal to the sum of the $V_{gs}$ of the transistor 40 and the voltage drop across the resistor $R_B$.

The combination of the transistors 34, 36, 38, 40 and the resistor $R_B$ provide a stable current reference that is supply independent. The stable current is reflected through the node 26.

The positive feedback circuit, comprising transistors 22, 28 and 32, operates to inject current into the transistors 34, 36, 38 and 40 in the event that the current through these devices is zero when a positive voltage is impressed across the power terminals 12 and 14. When the current through the transistors 34 and 36 is zero, the drain and gate of transistor 36 is one threshold voltage below the positive terminal 12, thus raising the gate voltage of the transistors 28 on node 30 to the same potential. This turns off the transistor 28 and no current flows through the drain and source terminals thereof. The drain of the transistor 32 is one threshold above the negative terminal 14, thereby pulling down the gate terminal of the transistor 22 connected to the node 24. This turns on the transistor 22 and current flows from the source terminal thereof to the drain terminal thereof and current is injected into the drain terminal of transistor 38 at node 26. As current is injected into the drain of transistor 38, this current is mirrored over to transistor 40. When transistor 40 begins to conduct current, transistor 36 also begins to conduct current, thus increasing the current through transistor 34. As the current builds up in transistor 34 and 36, the gate terminals thereof are pulled down from the positive terminal 12 and turn on the transistor 28. As transistor 28 turns on, the gate terminal of transistor 22 is pulled to a higher potential, thus turning off transistor 22.

The positive feedback circuit comprising transistors 22, 28 and 32 normally draws a low standby current when there is current through the transistors 34, 36, 38 and 40.

The first stage of amplification 18 includes a transistor 46 having the source terminal thereof connected to a node 48, the drain terminal thereof connected to a node 50 and the gate terminal thereof serving as the negative input to the amplifier and labeled "—". The source terminal of transistor 46 is connected to the substrate thereof. A transistor 52 has the source terminal thereof connected to the node 48, the drain terminal thereof connected to a node 54 and the gate terminal thereof serving as the positive input to the amplifier 18 and labeled "+". The source terminal of the transistor 52 is connected to the substrate thereof.

A transistor 56 has the source terminal thereof connected to the positive supply terminal 12, the drain terminal thereof connected to the node 50 and the gate terminal thereof connected to the drain terminal thereof. A transistor 60 has the source terminal thereof connected to the positive supply 12, the drain terminal thereof connected to the node 54 and the gate terminal thereof connected to the node 50.

The transistors 46, 52, 56 and 60 are configured as a different amplifier stage. The source terminals of the transistors 46 and 52 are connected to the substrate thereof to eliminate the back gate bias that would degrade the threshold voltage of the devices. This substrate connection also improves power supply rejection.

The transistors 56 and 60 act as the load to the common source input of the transistors 46 and 52. The combination of the transistors 56 and 60 act as a current mirror to provide double-to-single ended conversion for the amplifier 18. Without the transistors 56 and 60 the gain of the amplifier 18 would be one half of the present gain.

A transistor 62 has the source terminal thereof connected to the negative power supply terminal 14, the drain terminal thereof connected to the node 48 and the gate terminal thereof connected to the node 26. The transistor 62 acts as a current source for the transistor 46, 52, 56 and 60, thereby determining the bias current for the amplifier 18. The gate terminal of transistors 62 is connected to the output of the compensating bias circuit 16 at node 26. The transistor 62 will effectively reflect the current of the compensating bias circuit 16 in a proportionate manner that is determined by the width-to-length ratio of the channel in the transistor 62 as compared to the width to length ratio of the channel in the transistor 38. In this manner the compensating bias circuit 16 controls the bias current of the amplifier 18.

The second stage of amplification 20 includes a transistor 64. The transistor 64 has the source terminal thereof connected to the positive supply terminal 12, the drain terminal thereof connected to a node 66 and the gate terminal thereof connected to node 54 on the first stage of amplification 18.

A series connected resistors $R_F$ and capacitor $C_F$ are connected in feedback between the gate terminal of transistor 64 and the drain terminal thereof. A transistor 72 has the source terminal thereof connected to the negative power terminal 14, the drain terminal thereof connected to the node 66 and the gate terminal thereof connected to the node 26. The transistors 64 and 72 are operable as a common source amplifier stage. The transistor 72 acts in a similar manner to the transistor 62 in that it reflects the output current of the compensating bias circuit 16 to determine the bias current of the second stage of amplification 20.

Figure 2:
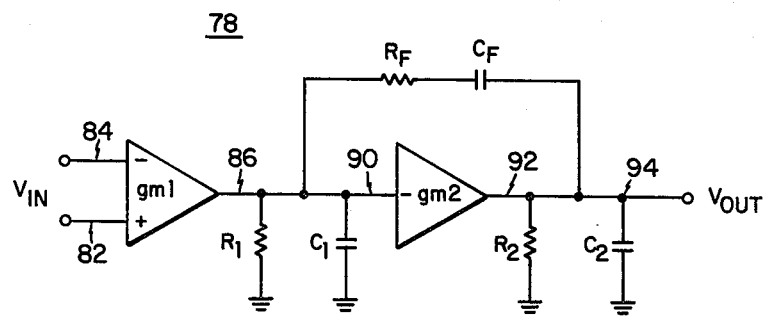
FIG. 2 is a schematic block diagram of the equivalent circuit of a two stage amplifier utilized in the circuit of FIG. 1.

Now referring to FIG. 2, there is shown a schematic block diagram of a two stage amplifier 78 which is the equivalent circuit of the first stage 18 and the second stage 20 in the circuit of FIG. 1. A first stage of amplification is provided by a transconductance gm, having a positive input 82, a negative input 84 and an output 86. A resistor $R_1$ is connected between the output 86 and ground. A capacitor $C_1$ is connected between the output 86 and ground.

Resistor $R_1$ represents the output impedance of the amplifier stage 18 of FIG. 1. Capacitor $C_1$ represents the capacitive load on the amplifier stage 18 of FIG. 1.

A second stage of amplification is provided by a transconductance - $g_{m2}$ having an input 90 and an output 92. The input 90 of the transconductance $g_{m1}$ is connected to the output 86 of the transconductance - $g_{m1}$. A resistor $R_2$ is connected between the output 92 and ground. A capacitor $C_2$ is connected between the output 92 and ground. The resistor $R_2$ represents the output impedance of the amplifier stage 20 of FIG. 1. The capacitor $C_2$ represents the capacitive loading on the output of the amplifier stage 20.

The output 92 of the transconductance - $g_{m2}$ is connected to a terminal 94 that represents the signal output $V_{out}$ of the circuit 78. The input terminals 82 and 84 of the transconductance $g_{m1}$ represent the signal input $V_{in}$ of the circuit 78.

The circuit 78 is an amplifier using an RC compensation method. The following is a more detailed description in terms of the frequency response of the amplifier 78 of FIG. 2. It may be shown for the circuit 78, that:

$$P_1 \simeq \frac{-1}{g_{m2}R_1R_2C_F} \simeq \frac{-g_{m1}}{A_vC_F} \tag{1}$$

$$P_2 \simeq \frac{-g_{m2}C_F}{C_1C_2 + C_F(C_1 + C_2)} \tag{2}$$

$$P_3 \simeq \frac{-1}{R_FC_1} \tag{3}$$

$$Z \simeq \frac{+g_{m2}}{C_F(1 - g_{m2}R_F)} \tag{4}$$

$P_1$, $P_2$, $P_3$ and $Z$ represent the poles and zero of the circuit 78, respectively. $A_v$ represents the overall voltage gain of the circuit 78.

Referring to equation 4, when $R_F$ is equal to $1/g_{m2}$, the zero is at infinity, leaving basically a two pole response (assuming $C_2$ much greater than $C_1$). For this case, minimal stability requires that:

$$P_2 \geq A_vP_1 \text{ or:} \tag{5}$$

$$C_f \geq \frac{g_{m1}}{g_{m2}} C_2. \tag{6}$$

Noise and power supply rejection considerations result in a fairly large $g_{m1}$ and a large $C_2$. Thus, a large $C_F$ or a large $g_{m2}$ must normally be used in the amplifier if it is to meet minimal stability requirements. Unfortunately, a large $C_F$ increases the die size and results in a slow settling time, while a large $g_{m2}$ requires increased die size and/or power dissipation. In the RC compensation technique, these unfavorable alternatives are avoided by bringing the zero in from infinity and placing it atop the second pole. This is seen to occur when:

$$P_2 = Z \text{ or} \tag{7}$$

$$\frac{-g_{m2}}{C_1C_2 + C_F(C_1 + C_2)} = \frac{g_{m2}}{C_F(1 - g_{m2}R_F)} \text{ and} \tag{8}$$

$$R_F = \frac{C_1 + C_2 + C_F(C_1 + C_2) + C_F^2}{g_{m2}C_F^2} \tag{9}$$

Now referring to FIGS. 1 and 2, the compensating bias circuit 16 will be described in more detail. Transistors 38 and 40 have respective gate to source voltages and threshold voltages. The relationship between the transistors is as follows:

$$V_{GS38} = V_{GS40} + I_{40}R_B \tag{10}$$

where $I_{40}$ is the current flowing from the drain to the source in transistor 40. Equation 10 expands into:

$$\sqrt{\frac{2I_{38}}{K_n'\left(\frac{W}{L}\right)_{38}}} + V_{TO38} = \sqrt{\frac{2I_{40}}{K_n'\left(\frac{W}{L}\right)_{40}}} + V_{TO40} + I_{40}R_B \tag{11}$$

where $K_n'$ is the product of electron mobility and oxide capacitance for an N-channel transistor and W/L is the width-to-length ratio of the channel region in the respective transistors.

The threshold voltages $V_{TO38}$ and $V_{TO40}$ are equal to each other. This result in the following equation:

$$I_{40} = \frac{\sqrt{\frac{2I_{38}}{K_n'\left(\frac{W}{L}\right)_{38}}} - \sqrt{\frac{2I_{40}}{K_n'\left(\frac{W}{L}\right)_{40}}}}{R_B} \tag{12}$$

The relationship between the current through transitor 38 and transistor 40 is determined by the width to length ratios of the current mirror transistors 34 and 36. If the width to length ratio of transistor 34 is set equal to twice the width to length ratio of transistor 36, then $$I_{34} = 2I_{36} \tag{13}$$

and thus $$I_{38} = 2I_{40}. \tag{14}$$

Now if the relationship is set as follows:

$$K_n'\left(\frac{W}{L}\right)_{40} = 2K_n'\left(\frac{W}{L}\right)_{38}. \tag{15}$$

and equations 14 and 15 are substituted into equation 12, solving for $I_{38}$ gives the following result:

$$I_{38} = \frac{2}{R_B}\left[\sqrt{\frac{2I_{38}}{K_n'\left(\frac{W}{L}\right)_{38}}} - \sqrt{\frac{2I_{38}}{4K_n'\left(\frac{W}{L}\right)_{38}}}\right] \tag{16}$$

which reduces to:

$$I_{38} = \frac{2}{K_n'\left(\frac{W}{L}\right)_{38}R_B^2} \tag{17}$$

It can be seen from equation 16 that:

$$I_{38} \propto \frac{1}{R_B^2}. \tag{18}$$

Now referring to FIGS. 1 and 2, the transconductance $gm_1$, the resistor $R_1$ and the capacitor $C_1$ of FIG. 2 are equivalent to the first stage of amplification 18 of FIG. 1 and the transconductance - $gm_2$, the resistor $R_2$ and the capacitor $C_2$ are equivalent to the second stage of amplification 20.

As described above, the current through the transistor 38 is reflected through the node 26 to the transistor 62 and 72. The current through the transistor 62 and the transistor 72 is proportional to the current in the transistor 38. The proportionality is a function of the width-to-length ratio of the transistors 62 and 72 and the width-to-length ratio of the transistor 38.

From equation 9 it can be seen that for pole-zero cancellation $g_{m2}$ is directly proportional to $1/R_F$. The fundamental relationship defining the transconductance term $g_{m2}$ is:

$$g_{m2} = \sqrt{2K' \frac{W}{L} I} \tag{19}$$

where $K'$ is a processing parameter that is the product of the electron mobility and the oxidation capacitance, $W/L$ is the width-to-length ratio and $I$ is the current through the transistor 64, which is the transistor whose transconductance is represented by $gm_2$. From equation 19 it can be seen that $g_{m2}$ is directly proportional to the square root of the current through the respective transistor.

The current for the first stage of amplification 18 is the current through the transistor 62 and the current for the second stage of amplification 20 is the current through the transistor 72. The transconductance of the first stage of amplification 18 is equivalent to $g_{m1}$ of FIG. 2 and the transconductance of the second stage of amplification 20 is equivalent to the $g_{m2}$ of FIG. 2.

From the principal of current ratios, if $$\left(\frac{W}{L}\right)_{72} = K \left(\frac{W}{L}\right)_{38} \tag{20}$$

where $K$ = constant
then, $$I_{72} = K I_{38} \tag{21}$$

which, when combined with equation 19, results in:

$$g_{m2} = \sqrt{2K_p' \left(\frac{W}{L}\right)_{64} K I_{38}} \tag{22}$$

where $K_p'$ is the processing parameter for the transistor 64. Substituting equation 17 for $I_{38}$ results in:

$$g_{m2} = \frac{2}{R_B} \sqrt{\frac{K_p' \left(\frac{W}{L}\right)_{64} K}{K_n' \left(\frac{W}{L}\right)_{38}}} \tag{23}$$

Therefore, it can be seen that, $$g_{m2} \propto \frac{1}{R_B} \tag{24}$$

As stated previously, for pole-zero cancellation $gm_2$ must be inversely proportional to $R_f$ and as proportionality 24 shows, $gm_2$ is inversely proportional to $R_B$. By processing both $R_F$ and $R_B$ in the same manner, $R_F$ and $R_B$ can be made to track each other, thus resulting in pole zero cancellation regardless of variations in the manufacturing process.

For example, if the impedance of $R_B$ increases due to process variations, then $R_F$ also increases. When $R_F$ and $R_B$ increase then, from equation 18, $I_{38}$ decreases in a squared relationship. Since $gm_2$ is proportional to the square root of $I_{38}$ (equation 22), $gm_2$ decreases by the same amount that $R_F$ and $R_B$ increased. Thus, the relationship of $g_{m2}$ to $R_F$ is maintained, that is, $g_m$ decreases when $R_F$ increases to give inverse proportionality.

In summary, an amplifier circuit is provided that has a frequency response which is independent of manufacturing process variations. Since the resistor $R_F$ and the resistor $R_B$ are the primary components that affect the pole-zero overlap, the design engineer need only concern himself with the initial design of these two resistors. As long as they are fabricated in the same process, the poles and zero will track.

Although the preferred embodiment of the invention has been described in detail, it should be understood that various changes, substitutions and alterations can be made therein without departing from the spirit and scope of the invention as defined by the appended claims.

We claim:
1. A circuit for producing a compensated output signal comprising:
   first amplifying means having an input and an output;
   second amplifying means having an input and an output, the input of said second amplifying means connected to the output of said first amplifying means;
   passive feedback means comprising a first resistive element connected between the input and the output of said second amplifying means for determining the frequency response of the combination of said first and second amplifying means, said passive feedback means varying the frequency response in response to manufacturing process variations;
   compensating means for varying the frequency response of said first and second amplifying means in response to manufacturing process variations, said compensating means comprising a second resistive element; and
   said passive feedback means and said compensating means manufactured in a common process wherein said compensating means counteracts frequency response variations of said first and second amplify- ing means resulting from said passive feedback means.

2. The circuit of claim 1 wherein said first amplifying means comprises a differential amplifier.

3. The circuit of claim 1 wherein said second amplifying means comprises a single stage common source amplifier.

4. The circuit of claim 1 wherein said passive feedback means further comprises a capacitor.

5. The circuit of claim 1 wherein said compensating means further comprises:
   a current source having a current that varies in response to manufacturing variations of said second resistive element;
   a first current control means for proportionally reflecting the output of said current source to said first amplifying means; and
   a second current control means for proportionally reflecting the output of said current source to said second amplifying means.

6. A tracking amplifier, comprising:
   a current reference circuit which includes a first resistor for determining the current flow through said current reference circuit;
   a first amplifier stage for receiving an input signal, said first amplifier stage including a first current source which passes the current through said first amplifier stage, the control terminal for said first current source connected to said current reference circuit;
   a second amplifier stage having an input thereof connected to the output of said first stage and generating an output signal for said tracking amplifier, said second amplifier stage including a second current source which passes the current through said second amplifier stage, the control terminal for said second current source connected to said current reference circuit, said second stage including a feedback circuit comprising a serially connected capacitor and second resistor, said first and second resistor fabricated in the same processing operation wherein parameter variations in said first resistor track with the parameter variations in said second resistor.

7. A circuit for producing a compensated output signal comprising:
   first amplifying means having a signal input, a signal output and a control input;
   second amplifying means having a signal input, a signal output and a control input;
   the signal input of said second amplifying means connected to the signal output of said first amplifying means;
   passive feedback means comprising a first resistive element connected between the signal input and the signal output of said second amplifying means for determining the frequency response of said first and second amplifying means, said passive feedback means varying the frequency response as a result of manufacturing process variations;
   compensating means connected to the control input of said first and second amplifying means for varying the frequency response of said first and second amplifying means in response to manufacturing process variations, said compensating means comprising a second resistive element; and
   said passive feedback means and said compensating means manufactured in a common process wherein said compensating means counteracts frequency response variations of said first and second amplifying means resulting from said passive feedback means.

8. The circuit of claim 7 wherein said first amplifying means comprises:
   a differential amplifier coupled to the signal input and the signal output of said first amplifier means; and
   a current source in series with the source of said differential amplifier, said current source coupled to the control input of said first amplifier means for varying the current therethrough.

9. The circuit of claim 7 wherein said second amplifying means comprises:
   a single stage common source amplifier coupled to the signal input and the signal output of said second amplifier means; and
   a current source in series with the drain of said common source amplifier, said current source coupled to the control input of said second amplifier means for varying the current therethrough.

10. The circuit of claim 7 wherein said passive feedback means comprises a serially connected resistor and capacitor.

11. The circuit of claim 7 wherein said compensating means further comprises a current source having a current that varies in response to manufacturing variations of said second resistive element, the output of said current source providing a control signal to the control input of said first and second amplifying means.

12. The circuit of claim 11 wherein said second resistive element determines said current of said current source.

13. A circuit for producing a compensated output signal comprising:
   a first stage of amplification having a signal input, a signal output and a control input;
   a second stage of amplification having a signal input, a signal output and a control input, the signal input of said second stage of amplification connected to the signal output of said first stage of amplification;
   a passive feedback network comprised of a first resistive element connected between the signal input and the signal output of said second stage of amplification, the combination of said passive feedback network, said first stage of amplification and said second stage of amplification having a gain and a frequency response defined by three poles and one zero, the zero overlapping one of the poles, said passive feedback network varying the frequency response in response to manufacturing process variations; and
   a compensation network comprised of a second resistive element connected to the control inputs of said first and second amplification stages, the output of said compensation network varying in response to manufacturing process variations, said passive feedback network and said compensation network manufactured in a common process wherein the processing variance of said compensation means varies the frequency response to counteract the variation in frequency response resulting from the processing variance of said passive feedback network, thereby providing a circuit having a frequency response substantially independent of manufacturing process variations.

14. The circuit of claim 13 wherein said first stage of amplification comprises:

a differential amplifier coupled to the signal input and the signal output of said first stage of amplification; and a variable current source in the source of said differential amplifier coupled to the control input of said first stage of amplification for varying the current thereof.

15. The circuit of claim 13 wherein said second stage of amplification comprises;

a single stage common source amplifier coupled to the signal input and the signal output of said second stage of amplification; and a variable current source in the source of said amplifier coupled to the control input of said second stage of amplification for varying the current thereof.

16. The circuit of claim 13 wherein said passive feedback network further comprises a capacitor.

17. The circuit of claim 13 wherein said compensation network further comprises a current source having a current that varies in response to manufacturing process variations of said second resistive element, the output of said current source providing a control signal to the control input of said first and second amplification stages.

18. The circuit of claim 17 wherein said second resistive element determines said current of said current source.

* * * * *